United States Patent
Le et al.

(10) Patent No.: US 6,891,404 B2
(45) Date of Patent: May 10, 2005

(54) AUTO-ADJUSTMENT OF SELF-REFRESH FREQUENCY

(75) Inventors: Thoai-Thai Le, Cary, NC (US); Juergen Lindolf, Friedberg (DE); Guenter Gerstmeier, Chapel Hill, NC (US)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 10/166,837

(22) Filed: Jun. 11, 2002

(65) Prior Publication Data

US 2003/0227307 A1 Dec. 11, 2003

(51) Int. Cl.$^7$ ................................................ H03K 9/06
(52) U.S. Cl. ........................................ 327/48; 327/525
(58) Field of Search .................... 331/44, 111–112, 331/149, 177 R, 179, 108 C, 117 R, 177, 40; 327/39–49, 151, 160, 525, 141, 156; 365/225.7

(56) References Cited

U.S. PATENT DOCUMENTS

| | | | |
|---|---|---|---|
| 6,005,447 A | * 12/1999 | Huang | 331/44 |
| 6,125,073 A | 9/2000 | Le et al. | 365/230.03 |
| 6,181,624 B1 | 1/2001 | Le et al. | 365/210 |
| 6,188,634 B1 | 2/2001 | Le | 365/230.06 |
| 6,215,351 B1 | 4/2001 | Le et al. | 327/525 |
| 6,226,219 B1 | 5/2001 | Le et al. | 365/230.06 |
| 6,278,292 B1 | 8/2001 | Le | 326/47 |
| 6,369,607 B2 | 4/2002 | Thoai-Thai | 326/38 |
| 6,389,086 B1 | 5/2002 | Le et al. | 375/350 |
| 6,417,722 B1 | 7/2002 | Schneider et al. | 327/534 |
| 6,429,503 B2 | 8/2002 | Lehr et al. | 257/530 |
| 6,445,630 B2 | 9/2002 | Ayadi et al. | 365/201 |
| 6,449,206 B2 | 9/2002 | Kaiser et al. | 365/225.7 |
| 6,456,553 B1 | 9/2002 | Brass et al. | 365/222 |
| 6,458,631 B1 | 10/2002 | Brintzinger et al. | 438/131 |
| 6,469,563 B2 | 10/2002 | Heyne et al. | 327/362 |
| 6,556,093 B2 * | 4/2003 | Craninckx et al. | 331/117 R |

* cited by examiner

Primary Examiner—My-Trang Nu Ton
(74) Attorney, Agent, or Firm—Brinks Hofer Gilson & Lione

(57) ABSTRACT

A method of adjusting a control signal that includes generating a control signal at an unknown frequency and automatically adjusting the unknown frequency of the control signal based on the unknown frequency.

19 Claims, 8 Drawing Sheets

AUTO-ADJUSTMENT OF SELF-REFRESH FREQUENCY

BACKGROUND OF THE INVENTION

1. Field of the Invention

The present invention relates to the field of memory chips.

2. Discussion of Related Art

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106. As shown in FIGS. 2 and 3, the memory storage cells 102 are arranged in arrays 108, wherein memory storage cells 102 in each array 108 are interconnected to one another via columns of conductors 110 and rows of conductors 112. As shown in FIG. 4, the transistors 104 are used to access the capacitors 106, allowing them to charge and discharge to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. In SDRAM, RAS/CAS/WE are sampled at the rising edge of the clock, its state defining the command to be executed in the CHIP. During a bank active command the address present on the DRAM address pins A0 to A11 are clocked into the bank of row address latches 214. During a READ or a WRITE command cycle, the address present on the DRAM address pins A0 to A11 are clocked into the bank of column address latches 216. The memory chip 200 has data input/output pins DQ0-15 that receive and send input signals and output signals. The input signals are relayed from the pins DQ0-15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read and Write, are well known and so there is no need to discuss them for the purpose of describing the present invention.

One mode of operation of a SDRAM memory chip is called Self Refresh. In this mode of operation the refreshing of the cells, either one row at a time (usually one row per refresh cycle) or groups of rows at a time, is initiated by refresh circuitry within the SDRAM memory chip that does not require intervention from the CPU or external refresh circuitry. Self-Refresh dramatically reduces power consumption and is often used in portable computers.

An example of a known Self-Refresh circuit 300 within SDRAM 200 is shown in FIG. 7. The circuit 300 includes a low frequency generator/oscillator 302, a 1:4 frequency divider 304 and a 1:32 frequency divider 306. In operation, an ENABLE signal EN is decoded by the incoming commands (or sent from the on-chip control logic), which triggers the oscillator 302 to generate a signal 308 that has a period of approximately 1 µs. The signal 308 is then fed to the 1:4 frequency divider 304 that generates a signal 310 that has a period of approximately 4 µs. The signal 310 is fed to the 1:32 frequency divider 306 where a Self-Refresh signal 312 is generated with a period of approximately 125 µs. The frequency of the Self-Refresh signal 312 is monitored on a DQ 314 pad upon entry into a test mode. Such monitoring includes sending a test mode activation signal TMSRF to the transfer gate 313 allowing the Self-Refresh signal to transfer to a DQ-Pad for monitoring. The frequency of the Self-Refresh signal 312 can be fine tuned and adjusted via trim fuses 318 and 320 associated with the oscillator 302 and the frequency divider 306, respectively.

One disadvantage of the circuit 300 is that an external measurement and hence a test mode is required to monitor the frequency of the Self-Refresh signal 312. Thus, the circuit 300 requires the use of external measuring devices that leads to an increase in costs and an increase in test time.

SUMMARY OF THE INVENTION

One aspect of the present invention regards a frequency adjustment system that includes an integrated circuit that generates a control signal at an unknown frequency and a frequency adjustment circuit that receives the control signal and automatically adjusts the unknown frequency of the control signal based on the unknown frequency.

A second aspect of the present invention regards a method of adjusting a control signal that includes generating a control signal at an unknown frequency and automatically adjusting the unknown frequency of the control signal based on the unknown frequency.

Each of the above aspects of the present invention provides the advantage of saving costs and reducing test time by eliminating the use of external measuring devices for testing the frequency of the Self-Refresh signal of a SDRAM memory chip.

The present invention, together with attendant objects and advantages, will be best understood with reference to the detailed description below in connection with the attached drawings.

DETAILED DESCRIPTION OF THE INVENTION

Figure 5:
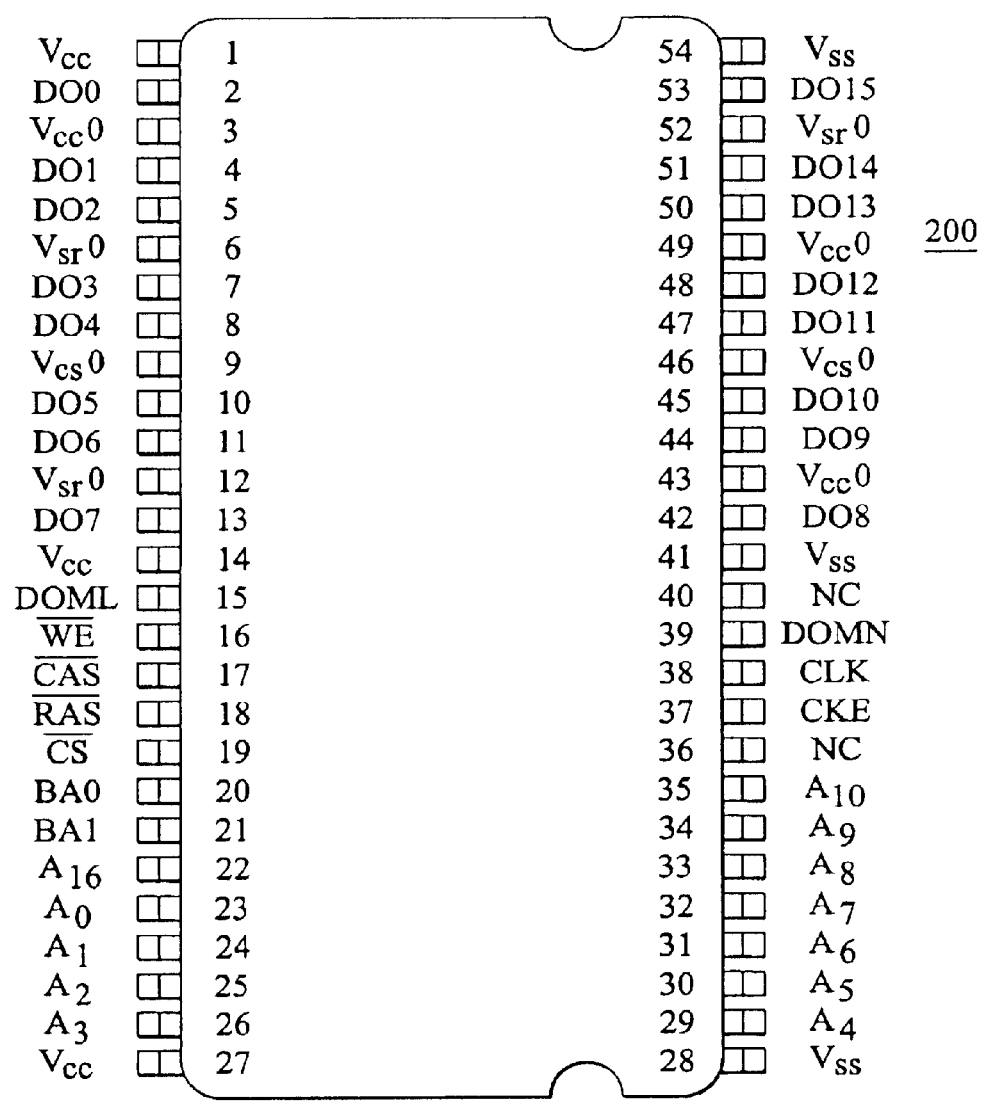
FIG. 5 schematically shows a top view of a second embodiment of a known memory chip.
Figure 6:
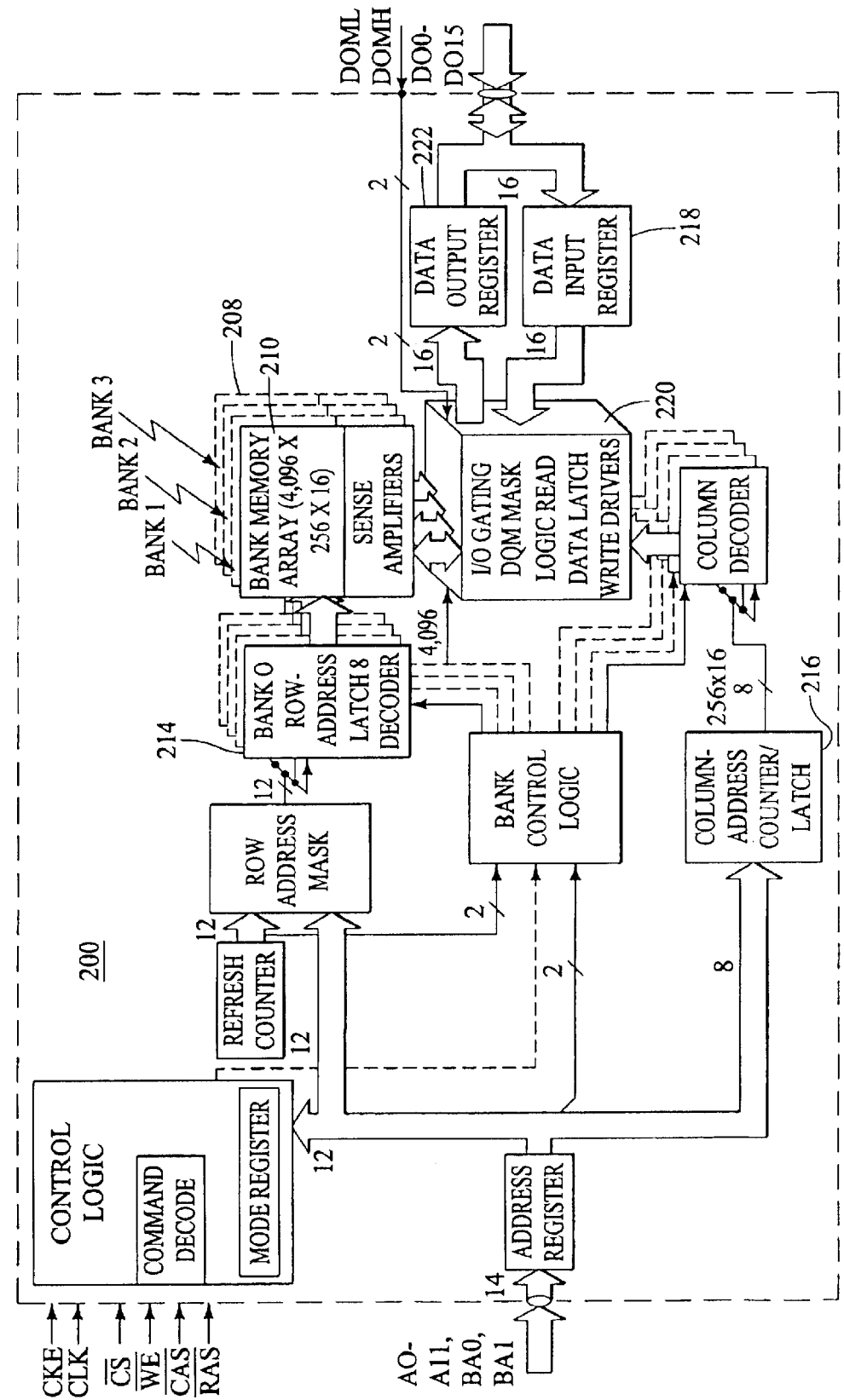
FIG. 6 shows a block diagram of the memory chip of FIG. 5.
Figure 7:
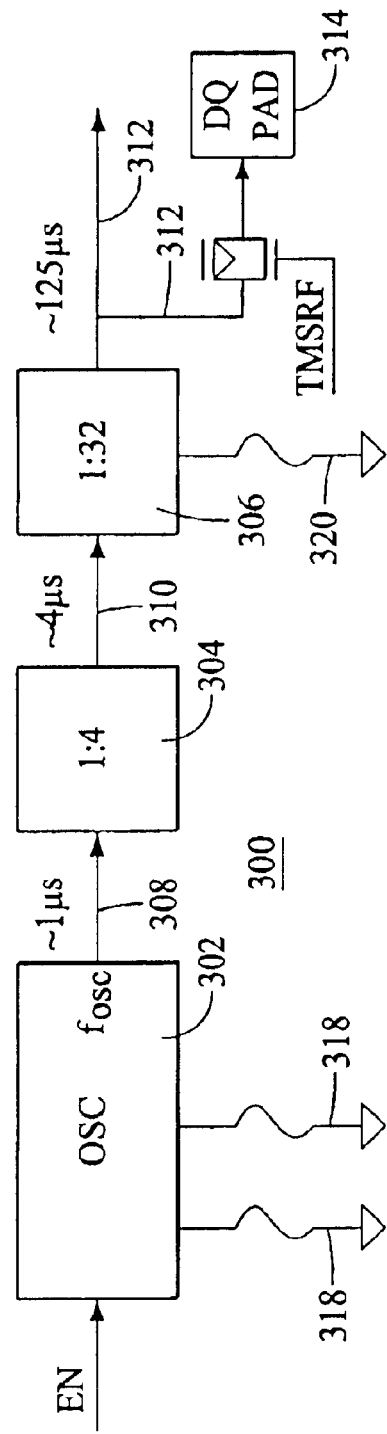
FIG. 7 schematically shows a known Self-Refresh circuit 300 that can be used with the memory chip of FIGS. 5 and 6.
Figure 8:
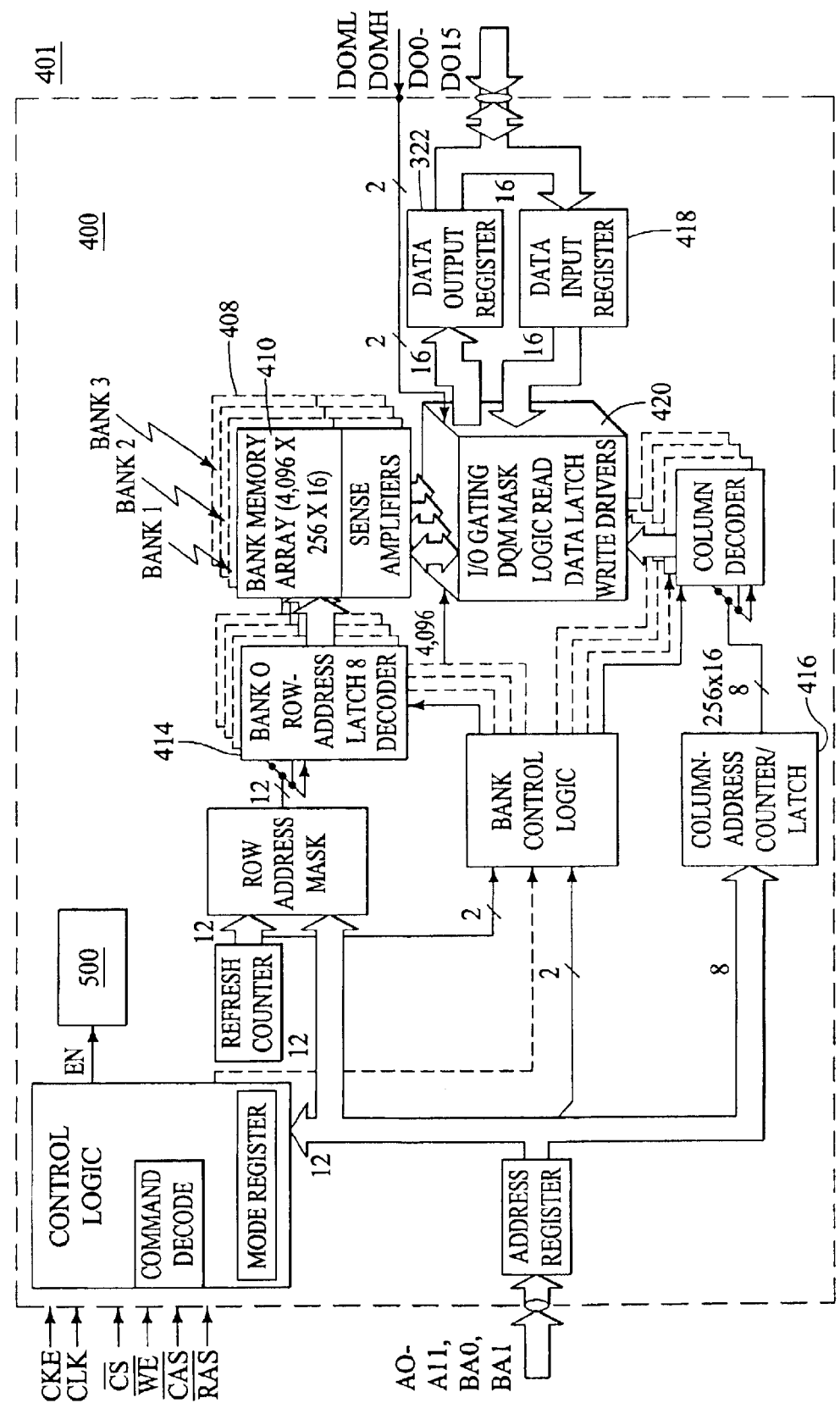
FIG. 8 schematically shows an embodiment of a memory chip that employs a Self-Refresh frequency adjustment system according to the present invention.

As shown in FIG. 8, a Self-Refresh frequency adjustment system 401 to be used with the present invention includes an integrated circuit, such as an SDRAM chip 400 that has a structure similar to that of the SDRAM chip 200 described previously with respect to FIGS. 5 and 6. The present invention can also be used in normal DRAMs. In the case of normal DRAMS, a reference clock signal must somehow be provided to the chip in order for the present invention to be implemented.

In such a Self-Refresh frequency adjustment system 401, the SDRAM chip 400 includes a bank of memory arrays 408 that include memory storage cells 410 interconnected to one another via columns and rows of conductors in a manner similar to the memory arrays 208 and memory storage cells 210 discussed previously. The memory chip 400 includes twelve address input contact pins A0–A11, row address strobe (RAS) input pin, column address strobe (CAS) input pin and data input/output pins DQ0-15 that receive and output signals in the same manner as their counterparts in the SDRAM chip 200 discussed previously. It should be noted that the present invention could be used with other types of memory chips, such as other types of semiconductor integrated circuits and other types of memory devices, such as SDRAMS and DDR SDRAMS.

The signals associated with the input contact pins A0–A11 are fed to a bank of row address latches 414 and a bank of column address latches 416 that correspond to and operate in the same manner as the latches 214 and 216, respectively. The signals associated with the data input/output pins DQO-15 are relayed to or from data input register 418, data output register 422 and DQM processing component 420 that correspond to and operate in the same manner as registers 218, 222 and DQM processing component 220, respectively. Note that the DQM processing component 420 includes read data latches and write data latches.

Figure 1:
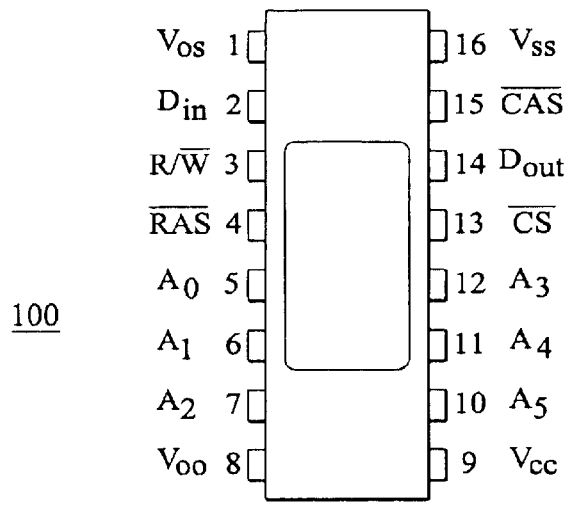
FIG. 1 schematically shows a top view of an embodiment of a known memory chip.
Figure 2:
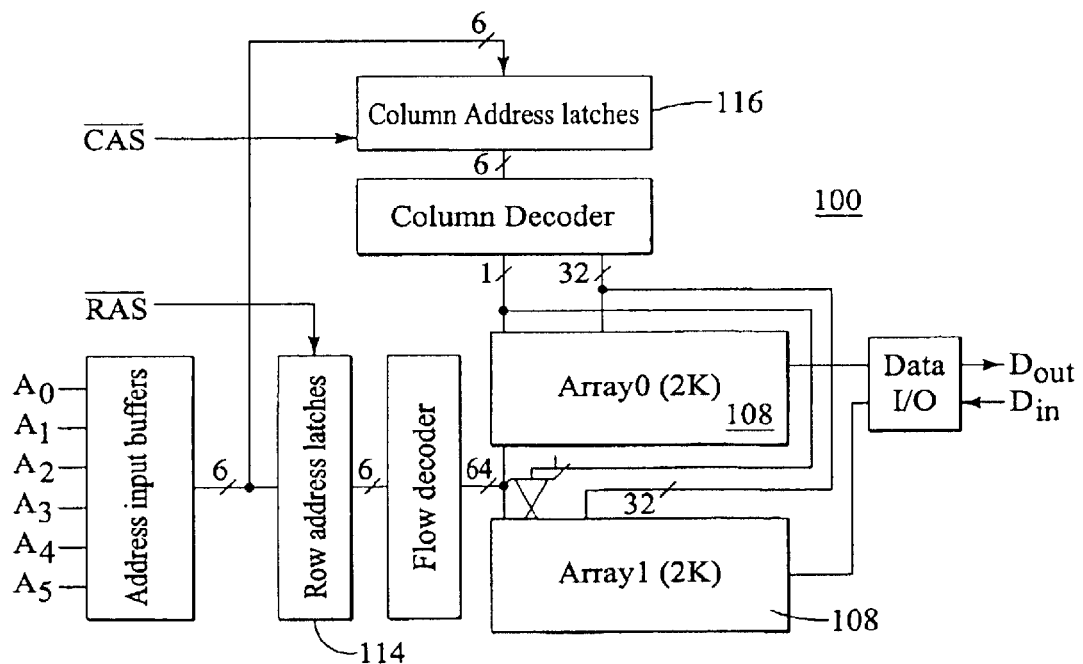
FIG. 2 shows a block diagram of the memory chip of FIG. 1.
Figure 3:
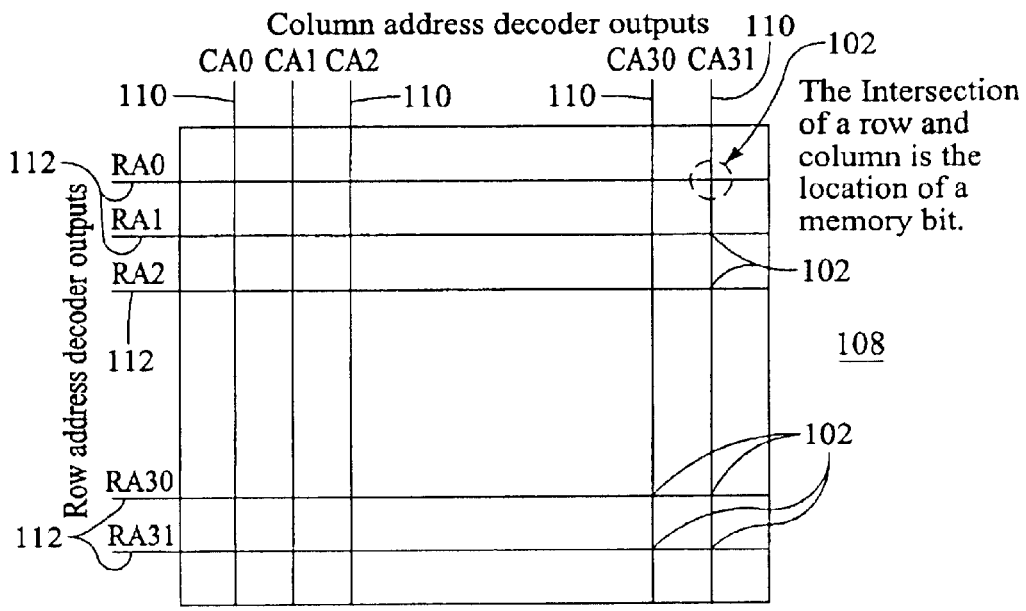
FIG. 3 schematically shows an embodiment of a memory array to be used with the memory chip of FIG. 1.
Figure 4:
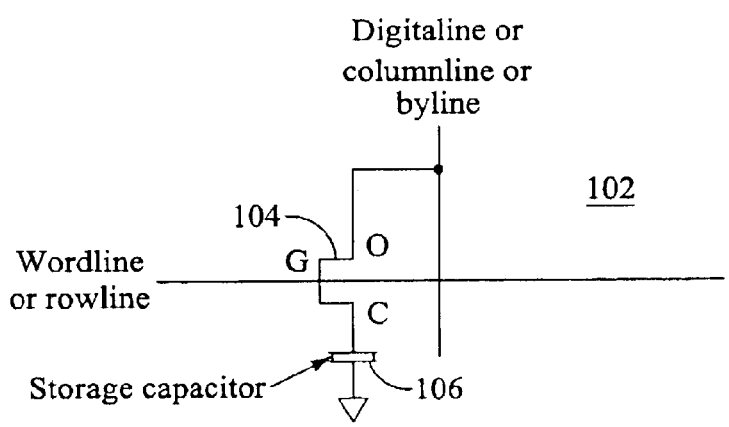
FIG. 4 schematically shows an embodiment of a memory cell to be used with the memory array of FIG. 3.
Figure 9:
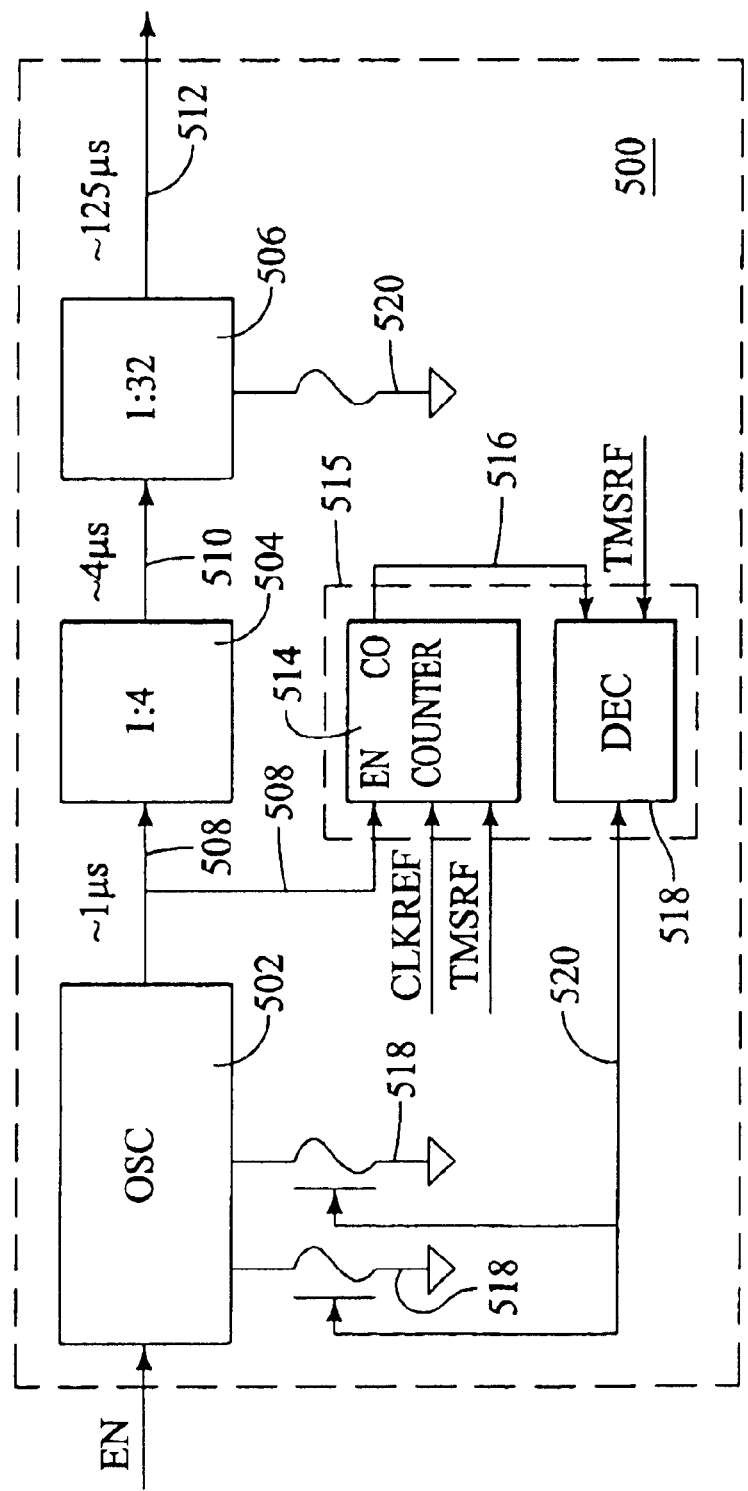
FIG. 9 schematically shows an embodiment of a Self-Refresh circuit according to the present invention to be used with the memory chip of FIG. 8.
Figure 10:
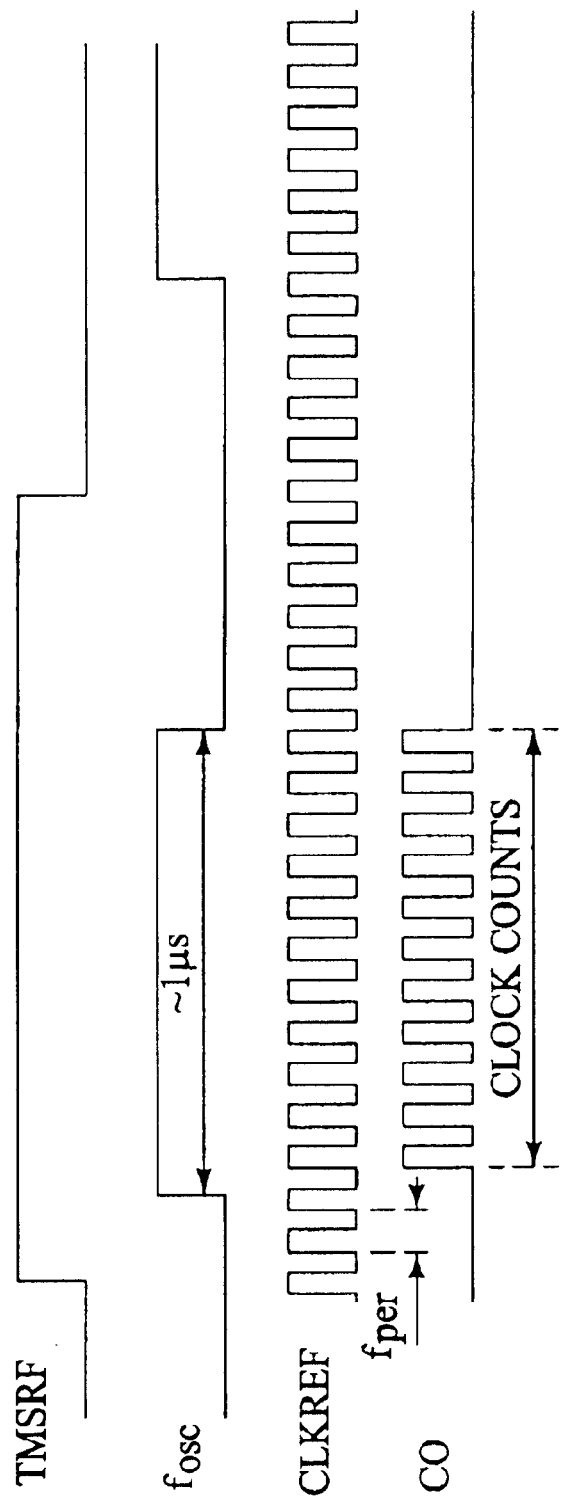
FIG. 10 shows an embodiment of a timing diagram to be used with the memory chip of FIG. 8 and the Self-Refresh circuit of FIG. 9 according to the present invention.

As shown in FIG. 9, the Self-Refresh frequency adjustment system 401 further includes a circuit 500 that includes an low frequency generator/oscillator 502 that is part of the SDRAM chip 400, a 1:4 frequency divider 504 and a 1:32 frequency divider 506 that are similar to the oscillator 302, frequency divider 304 and frequency divider 306, respectively, discussed previously. In operation, an ENABLE signal EN is sent from the on-chip control logic, which triggers the oscillator 502 to generate a control signal 508 of unknown frequency. Note that while the frequency/period of the control signal 508 is unknown, it preferably has a period in the neighborhood of approximately 1 µs. The signal 508 is then fed to the 1:4 frequency divider 504 and a counter 514 of a frequency adjustment circuit 515. The counter 514 receives two other signals: 1) the TMSRF enable signal for the counter 514 shown in FIG. 10 and 2) a reference clock signal CLKREF also shown in FIG. 10. The reference clock signal is periodic, has a known period/frequency and is generated from the system clock of the SDRAM chip 400 that defines all interface timings. The system clock is used as a reference to measure the frequency of the oscillator 502 since the period of the system clock is known. Note that the counter 514 can be any preexisting counter of the SDRAM chip 400, such as the address counter used in BUILT-IN SELF TEST (BIST) or the counter for the 1:32 frequency divider 506.

The counter 514 counts the maximum number of consecutive clock pulses of the reference clock signal CLKREF that are within a pulse of the signal 508 generated by the oscillator 502 when the Self-Refresh test mode is activated (TMSRF=1). A counter signal CO, 516 representative of the maximum number of consecutive pulses counted by counter 514 is then sent to a decoder 518 of the frequency adjustment circuit 515, which decodes the signal by multiplying the number of pulses counted by counter 514 by the known period of the reference clock signal to provide an adjustment signal 520 representative of the frequency of the signal 508. As explained below, the signal 520 is used to automatically adjust the frequency of the signal 508 generated by the oscillator 502.

The signal 520 is sent to electrical fuses 518 that fine tune the oscillator 502 based on signal 520. The fine-tuned or modified signal of the oscillator 502 is sent to the frequency divider 504 that generates a signal 510 that has a period of approximately 4 µs. The signal 510 is fed to the 1:32 frequency divider 506 where a Self-Refresh signal 512 is generated with a period of approximately 125 µs. The frequency of the Self-Refresh signal 512 can be fine tuned and adjusted via laser trim fuses 520 associated with the frequency divider 506.

Note that the purpose of the fine-tuning of the frequency by the oscillator 502 is to get a correct time base. The purpose of the fine-tuning performed by the frequency divider 506 is to adjust the real refresh frequency, which is dependent on the retention time of the memory array. This retention time is a process parameter and can vary from chip to chip.

The foregoing description is provided to illustrate the invention, and is not to be construed as a limitation. Numerous additions, substitutions and other changes can be made to the invention without departing from its scope as set forth in the appended claims.

We claim:

1. A frequency adjustment system, comprising:
   an integrated circuit for generating a control signal, said integrated circuit being adapted to receive an ENABLE-signal, the integrated circuit being triggered by said ENABLE-signal to generate said control signal; and
   a frequency adjustment circuit that receives said control signal generated by said integrated circuit, said frequency adjustment circuit comprising:

means for determining a value of a frequency of said control signal received by said frequency adjustment circuit and generating an adjustment signal representative of said determined frequency value, said means for determining a frequency value comprising:

a counter that receives said control signal and a reference signal, and determines a maximum number of consecutive pulses of said reference signal that are contained within one pulse of said control signal; and a decoder that receives a counter signal from said counter representative of said maximum number of consecutive pulses and generates said adjustment signal based on said counter signal; and means for automatically fine-tuning said integrated circuit based on said adjustment signal, such that said integrated circuit is adjusted to generate said control signal at a modified frequency, the modified frequency being different from said determined frequency value.

2. The frequency adjustment system of claim 1, wherein said integrated circuit comprises an oscillator for generating said control signal.

3. The frequency adjustment system of claim 1, wherein said frequency adjustment circuit further receives said reference signal that is periodic and has a known period, wherein said frequency adjustment circuit determines said frequency value based on said reference signal.

4. The frequency adjustment system of claim 3, wherein said reference signal is a clock signal of said integrated circuit.

5. The frequency adjustment system of claim 1, wherein said decoder multiplies said maximum number by said known period.

6. The frequency adjustment system of claim 1, wherein said integrated circuit comprises an oscillator for generating said control signal, the oscillator adapted and to receive said adjustment signal and generate said control signal at said modified frequency based on said adjustment signal.

7. The frequency adjustment system of claim 6, wherein said decoder multiplies said maximum number by said known period.

8. The frequency adjustment system of claim 6, wherein said means for fine-tuning comprises a fuse attached to said oscillator, said fuse receives said adjustment signal and controls said oscillator to generate said control signal at said modified frequency.

9. The frequency adjustment system of claim 1, further comprising a frequency divider connected to said integrated circuit for receiving said control signal.

10. The frequency adjustment system of claim 9, wherein said means for automatically fine-tuning comprises means for fine-tuning said frequency divider.

11. The frequency adjustment system of claim 1, wherein said control signal is a Self-Refresh control signal of a SDRAM memory.

12. The frequency adjustment system of claim 1, wherein the frequency adjustment system is arranged on a DRAM Chip.

13. The frequency adjustment system of claim 1, wherein the frequency adjustment system is arranged on a SDRAM Chip.

14. A method of adjusting a control signal comprising:

generating a control signal of a memory array, said control signal being triggered by an ENABLE SIGNAL;

determining a value of a frequency of said control signal;

generating said control signal at a modified frequency, the modified frequency being different from said determining value of frequency of said control signal;

transmitting said control signal to a frequency divider; and adjusting said frequency divider dependent on a retention time of said memory array.

15. The method of claim 14, wherein said value of said frequency of said control signal is determined based on a known period of a periodic reference signal.

16. The method of claim 15, wherein said reference signal is a clock signal of a DRAM memory.

17. The method of claim 15, wherein said reference signal is a clock signal of a SDRAM memory.

18. The method of claim 17, wherein said control signal is a Self-Refresh control signal.

19. The method of claim 15, further comprising determining a maximum number of consecutive pulses of said reference signal that are contained within one pulse of said control signal, wherein said adjusting is based on said maximum number.

* * * * *